United States Patent [19]

Miyagi et al.

[11] Patent Number: 5,540,782
[45] Date of Patent: Jul. 30, 1996

[54] HEAT TREATING APPARATUS HAVING HEAT TRANSMISSION-PREVENTING PLATES

[75] Inventors: Katsushin Miyagi, Sagamihara; Miyuki Yamahara, Zama, both of Japan

[73] Assignees: Tokyo Electron Kabushiki Kaisha; Tokyo Electron Tohoku Kabushiki Kaisha, both of Japan

[21] Appl. No.: 135,481

[22] Filed: Oct. 13, 1993

[30] Foreign Application Priority Data

Oct. 15, 1992 [JP] Japan .................................. 4-303128

[51] Int. Cl.$^6$ .................................................. C23C 16/00
[52] U.S. Cl. ................................... 118/724; 118/726
[58] Field of Search .................................. 266/251, 256; 118/715, 719, 724, 725, 726, 733

[56] References Cited

U.S. PATENT DOCUMENTS

| | | | |
|---|---|---|---|
| 3,699,298 | 10/1972 | Briody ............................. | 118/48 |
| 4,062,318 | 12/1977 | Ban et al. ........................ | 118/500 |
| 5,029,554 | 7/1991 | Miyazaki et al. ................ | 118/725 |
| 5,048,800 | 9/1991 | Miyazaki et al. ................ | 266/256 |
| 5,127,365 | 7/1992 | Koyama et al. ................. | 118/733 |
| 5,320,680 | 6/1994 | Learn et al. ..................... | 118/724 |

FOREIGN PATENT DOCUMENTS 4-65328  2/1992  Japan .

*Primary Examiner*—Mary Wilczewski
*Assistant Examiner*—Brian K. Dutton
*Attorney, Agent, or Firm*—Beveridge, DeGrandi, Weilacher & Young, L.L.P.

[57] ABSTRACT

A heat-treating apparatus for heat treating a plurality of objects-to-be-treated (semiconductor wafers) by loading the objects-to-be-treated into a heat treatment vessel having the lower end opened, mounted on a heat-treatment boat vertically spaced from each other, and sealing the opened end includes a heat insulator disposed on the lower end portion of the heat-treatment boat for heat-insulating the interior of the reaction vessel. The heat-insulator includes heat transmission preventing plates of opaque quartz for preventing the transmission of heat rays from a heater, and a support for supporting the heat transmission preventing plates. Thus sufficient heat-insulating effect for a heat-treating operation can be achieved, and stable heat-treatment can be conducted without impairing the function of sealing the heat-insulating unit. Furthermore, particle formation can be prevented, with a result of improved yields of the heat-treatment.

25 Claims, 4 Drawing Sheets

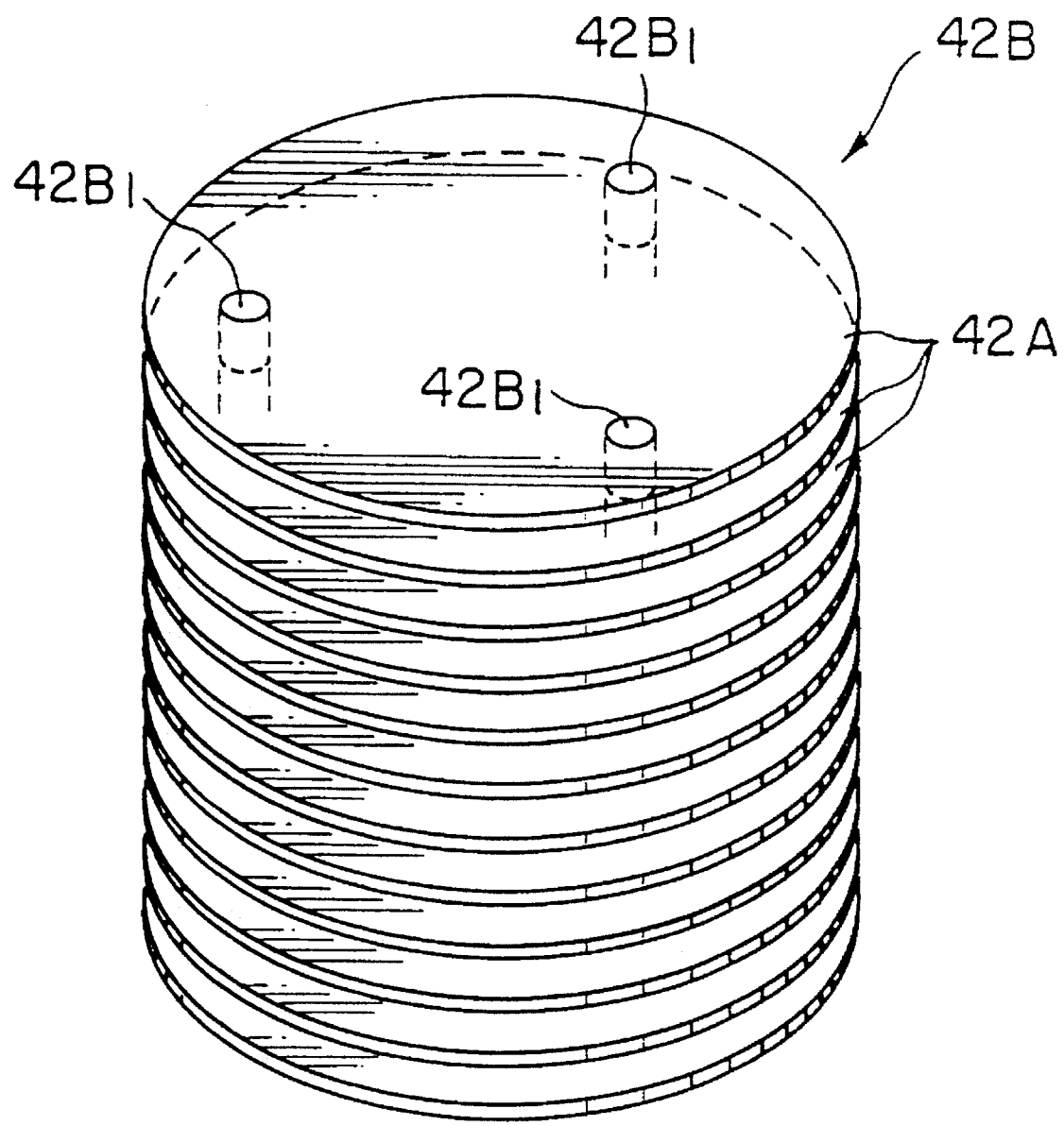
F I G. 4

HEAT TREATING APPARATUS HAVING HEAT TRANSMISSION-PREVENTING PLATES

BACKGROUND OF THE INVENTION

This invention relates to a heat treating apparatus for heat-treating objects to be treated, such as semiconductor wafers, etc.

As a conventional heat treating apparatus of this kind is known a low-pressure CVD (LPCVD) apparatus including a heat treatment furnace exemplified in FIG. 5. As shown in FIG. 5, this LPCVD apparatus includes a heating furnace 20 disposed upright on a base mounted on a frame 10A, a double-wall reaction vessel 30 of quartz housed in the heating furnace coaxially therewith, and a heat-treatment boat 40 to be loaded into and unloaded out of the reaction vessel 30 for mounting a plurality of objects-to-be-heat treated, i.e., wafers, vertically spaced from each other. This heat-treatment boat 40 is coaxially loaded into the reaction vessel 30 to form silicon nitride films or others on the surfaces of the wafers W mounted on the heat-treatment boat 40 at a set reduced pressure.

The reaction vessel 30 includes the double-wall vessel having an outer cylinder 31 having only the lower end opened, and an inner cylinder 32 coaxially inserted in the outer cylinder 31, and a manifold 33 disposed at the lower end of the double-wall vessel. The manifold 33 is made of stainless steel and is tightly engaged with the flange on the flower end of the outer cylinder 31 through an O-ring 34 of a heat-resistant resilient material. The manifold 33 bears the inner cylinder 32 at an extension 33A from the inside thereof and is to engage with a flange of the heat treatment boat 40 through a heat-resistant resilient O-ring 35 to thereby seal the reaction vessel 30 to retain the set reduced pressure.

The manifold 33 further includes an exhaust pipe 33B (of the same material as the manifold 33) connected to an exhaust system, such as a vacuum pump, for evacuating the interior of the reaction vessel 30, a gas feed pipe 33C of a heat-resistant, corrosion-resistant material inserted in the manifold 33 at a position on the exterior thereof offset from the exhaust pipe 33B and bent upward along the inside circumferential wall of the outer cylinder 31 for introducing an inert gas, such as nitrogen gas or others, into the reaction vessel 30, and a source gas feed pipe 33D of a heat-resistant, corrosion-resistant material, such as quartz, bent upward long the inside circumferential wall of the inner cylinder 32 for introducing a heat-treatment source gas (reaction gas). The source gas feed pipe 33D introduces source gases, e.g., dichlorosilane and ammonium for heat-treatment or others. Cooling water passages 33E, 33F are formed circumferentially in the flange at the upper end of the manifold 33 and in a thicker portion at the lower end for the prevention of thermal degradation of the respective O-rings 34, 35 near the cooling water passages 33E, 33F.

The heat treatment boat 40 includes a wafer support 41 having a plurality of notches formed at a set interval vertically therein for supporting a plurality of wafers W, a heat insulator 42 disposed on the lower end of the wafer support 41 for heat-insulating the interior of the reaction vessel 30 on the outside thereof to keep the interior thereof at a set temperature, a magnetic seal shaft 43 connected to the center of the underside of the heat-insulator 42, and a flange 45 having a magnetic seal unit 44 connected to the magnetic seal shaft 43 secured thereto. The wafer support 41 inserted in the reaction vessel 30 is rotated by a magnetic fluid in the magnetic seal unit 44.

The heat-insulator 42 includes four plates 42A of quartz, a support 42B having a plurality of support rods or others which support the plates 42A horizontally at their peripheries at a set vertical interval. The heat-insulator 42 further includes a heat-insulating body 42C which is disposed below the support 42B, filled with quartz wool and evacuated, and a cylinder 42D surrounding the substrates and made of the same material as the substrates 42B, and a base 42E which bears these members.

Next, the formation of a silicon nitride film on a wafer F by this low-pressure CVD apparatus will be explained. First, the interior of the reaction vessel 30 is set at 700°–800° C. by the heating furnace 20, the heat-treatment boat 40 is inserted into the reaction vessel 30, and the reaction vessel 30 is sealed, and then the interior of the reaction vessel 30 is evacuated to a set low pressure by the exhaust pipe 33B. Then ammonium and dichlorosilane as source gases are introduced into the reaction through the source gas introduction pipe 33D to form a silicon nitride film on the wafer F by the reaction the ammonium with dichlorosilane. After the film formation is over, an inert gas, such as nitrogen or others, is introduced into the reaction vessel 30 through the gas introduction pipe 33C to replace the gas in the reaction vessel with the inert gas and purge the reaction vessel therefrom, and the pressure in the reaction vessel 30 is returned to atmospheric pressure, and the heat-treatment boat 40 is unloaded from the reaction vessel 30.

In the conventional low-pressure CVD apparatus of FIG. 5, the heat insulating body 42C has good heat-insulating performance, but the hollow container of the heat insulating body 42C is not perfectly sealed at the evacuation portion. Air leaks there, which results in the problems that the film forming reaction is impaired, the heat-insulating performance is lowered, and cracks are caused in the evacuation portion, which damage the heat insulator 42C. This heat-insulating body 42C has such good heat-insulation that the manifold 33 and the sealing flange can be kept at below 100° C. and prevent the O-rings 34, 35 from heat degradation, but reaction gases between the ammonium and dichlorosilane, etc. in the reaction vessel 30 are apt to have side-reactions to resultantly generate particles, such as ammonium chloride, etc. Yields of the heat-treatment of the wafers are lowered by the particles. Especially in micronized processing in sub-microns, as in 4 MDRAMs, it is a problem that the generated particles adversely affect the film formation.

SUMMARY OF THE INVENTION

This invention has been made to solve the above-described problem. An object of this invention is to provide a heat-treating apparatus which can exhibit sufficient heat-insulation for the heat-treatment, can conduct stable heat-treatment without impairing sealing of the heat-treatment vessel, and can preclude the generation of particles for the improvement of yields of the heat-treatment.

The heat-treating apparaatus according to this invention comprises holding means for loading into a heat-treatment vessel having one end opened, holding a plurality of objects-to-be-treated, and sealing the heat-treatment vessel for heat-treatment of the objects-to-be-treated; and a heat insulator disposed at least one end of the holding means for heat-insulating an interior of the heat treatment vessel in a heat-treating operation, the heat-insulator including heat transmission preventing plates for preventing transmission of heat rays in a heat treatment operation; and a support for supporting the heat transmission preventing substrates horizontally.

According to the heat-treating apparatus of this invention, the holding means is inserted in the vessel, seals the opening of the vessel with the holding means so that objects-to-be-treated may be subjected to heat-treatment. In a heat-treating operation, the heat transmission preventing plates of the heat insulator prevent the transmission of heat rays in the vessel to thereby prevent drops of an interior temperature of the vessel. At the same time, temperature rises in the vicinity of the heat insulator are suppressed to thereby prevent damages of the sealing mechanism near the heat insulator, whereby a pressure-reduced state in the vessel is stabilized, and generation of particles due to fed gases can be prevented.

BRIEF DESCRIPTION OF THE DRAWINGS

FIG. 4 is a perspective view of another example of the heat transmission preventing substrate.

DETAILED DESCRIPTION OF THE PREFERRED EMBODIMENTS

The heat-treating apparatus according to this invention will be explained by means of one embodiment of this invention shown in FIGS. 1 to 3.

Figure 1:
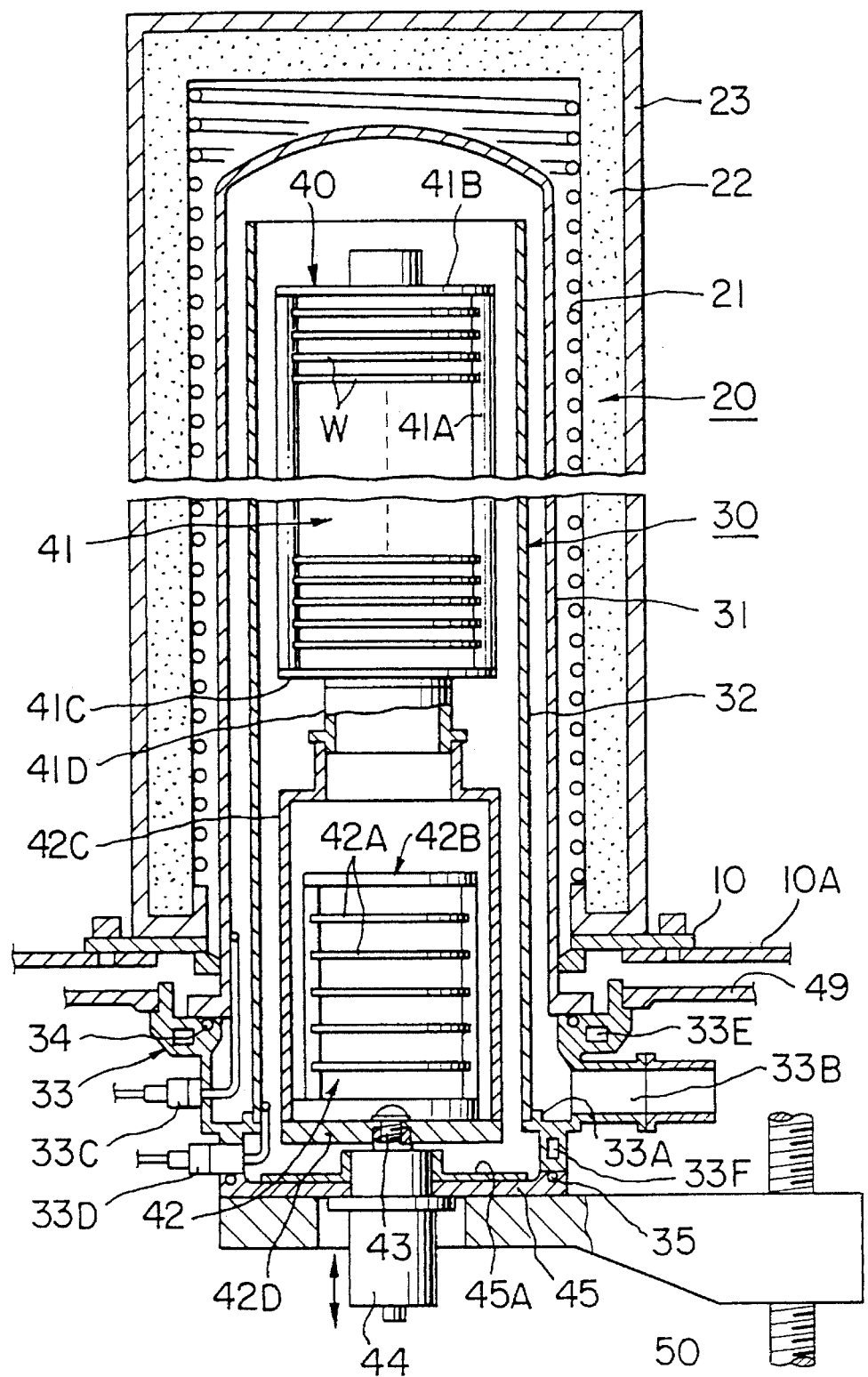
FIG. 1 is a vertical section view of a major part of one embodiment of the heat treating apparatus according to this invention.

As shown in FIG. 1, the heat-treating apparatus according to this embodiment comprises a heating furnace 20 disposed upright on a base 10 mounted on a frame 10A, a double-wall vessel for heat treatment (hereinafter called "reaction vessel") having one end opened and inserted in the heating furnace 20 coaxially therewith, and holding means 40 (hereinafter called "heat-treatment boat") which holds a plurality of (e.g., 100–150 sheets) of objects-to-be-heat treated (hereinafter called "wafers"). When wafers W are heat-treated, the heat-treatment boat 40 is moved up along the indicated arrow by a lift mechanism (elevator) 50 to be loaded into the reaction vessel 30, and when the wafers W have been heat-treated, the heat-treatment boat (wafer boat) 40 is moved down by the lift mechanism 50 to be unloaded from the reaction vessel 30. The heating furnace 20 is a cylinder having the upper end closed and the lower end opened. That is, as shown in FIG. 1, the heating furnace 20 comprises a resistance heater 21 in the shape of a coil provided on the inside surface of a straight barrel, a heat insulating material 22 holding the resistance heater 21 and covering the entire inside surfaces of the straight barrel and of the upper surface thereof, and a shell 23 of, e.g., a stainless steel for covering the entire outside surface of the heat insulating material 22. The resistance heater 21 heats and stably maintains the reaction vessel 30 at a temperature required for the heat-treatment of the wafers W, e.g., 500°–1200°, along its entire length to enable the reaction vessel 30 to conduct the heat-treatment.

The reaction vessel 30 coaxially inserted in the heating furnace 20 is provided by a double-wall vessel comprising, as shown in FIG. 1, an outer cylinder 31 of a heat-resistant, corrosion-resistant material, such as quartz or others, having the upper end closed and the lower end opened, and an inner cylinder 32 of the same heat-resistant, and corrosion-resistant material as the outer cylinder 31 having both ends opened and disposed coaxially inside the outer cylinder 31 at a gap. The reaction vessel 30 further comprises a manifold 33 of a metal, such as stainless steel or others, which is supported on a wall 49 constituting a double wall together with the base 10. The manifold 33 is in tight engagement with the lower end of the outer cylinder 31 through an O-ring 34 of a heat-resistant, resilient material, and supports the inner cylinder 32 on an extension 33A horizontally projected from the inside surface thereof.

The manifold 33 further includes an exhaust pipe 33B (of the same material as the manifold 33) connected to an exhaust system, such as a vacuum pump, for evacuating the interior of the reaction vessel 30, a gas feed pipe 33C of a heat-resistant, corrosion-resistant material inserted in the manifold 33 at a position on the exterior thereof offset from the exhaust pipe 33B and bent upward along the inside circumferential wall of the outer cylinder 31 for introducing an inert gas, such as nitrogen gas or others, into the reaction vessel 30, and a source gas feed pipe 33D of a heat-resistant, corrosion-resistant material, such as quartz, bent upward long the inside circumferential wall of the inner cylinder 32 for introducing heat-treatment source gases (reaction gas) into the reaction vessel 30. The source gas feed pipe 33D introduces source gases, e.g., dichlorosilane and ammonium for heat-treatment or others to form thin films, such as silicon nitride films or others, on the surfaces of the wafers W by the reaction of both gases. Cooling water passages 33E, 33F for cooling water to respectively circumferentially flow through are formed in the flange at the upper end of the manifold 33 and in a thicker portion at the lower end. The cooling water flowing through the cooling water passages 33E, 33F cools the heated manifold 33 to prevent thermal degradation of the O-rings 34, 35 near the cooling water passages 33E, 33F, whereby the metal surfaces of the manifold 33 and its flange are maintained at 110°–180° C.

The heat treatment boat 40 to be loaded into and unloaded from reaction vessel 30 is formed of a heat-resistant, corrosion-resistant material, such as quartz, and comprises a wafer support 41 having a plurality of notches (e.g., 100–150) formed at a set interval vertically therein for supporting a plurality of wafers W, a heat insulator 42 disposed on the lower end of the wafer support 41 for heat-insulating the interior of the reaction vessel 30 on the outside thereof to keep the interior thereof at a set temperature, a magnetic seal shaft 43 connected to the center of the underside of the heat-insulator 42, and a flange 45 having a magnetic seal unit 44 connected to the magnetic seal shaft 43 secured to. The heat-treatment boat 40 inserted in the reaction vessel 30 is rotated by a magnetic fluid in the magnetic seal unit 44. The inside surface of the flange unit 44 is provided with ceramics 45A, such as quartz or others, for preventing the generation of products from the flange 45 during the heat-treatment.

The wafer support 41 comprises, for example, 4 wafer support rods 41A, a pair of discs 41B, 41C integrated with the four support rods 41A for securing the four wafer support rods 41 circumferentially equidistantly at both ends thereof, and a cylinder 41D having a flange attached to the lower disc 41C, and the cylinder has the upper end engaged in the heat insulator 42.

The heat insulator 42 engaged with the wafer support 41 is a major part of this embodiment of the heat-treating apparatus according to this invention. As in FIG. 1, the heat insulator 42 comprises five heat-ray transmission preventing plates 42A for preventing the transmission of heat rays radiated in all spherical directions from the heater 21 in the heat-treatment, a support body 42B of opaque quartz having a plurality of support rods for supporting the heat transmission preventing plates 42A horizontally at the peripheral edges and at a set vertical interval, a cylinder 42C of ceramics, such as quartz or others, surrounding the support body 42B, and a receiver 42D for bearing the cylinder 42C and the support body 42B. Thus the heat insulator 42 heat-insulates the reaction vessel 30 on the outside.

Figure 2:
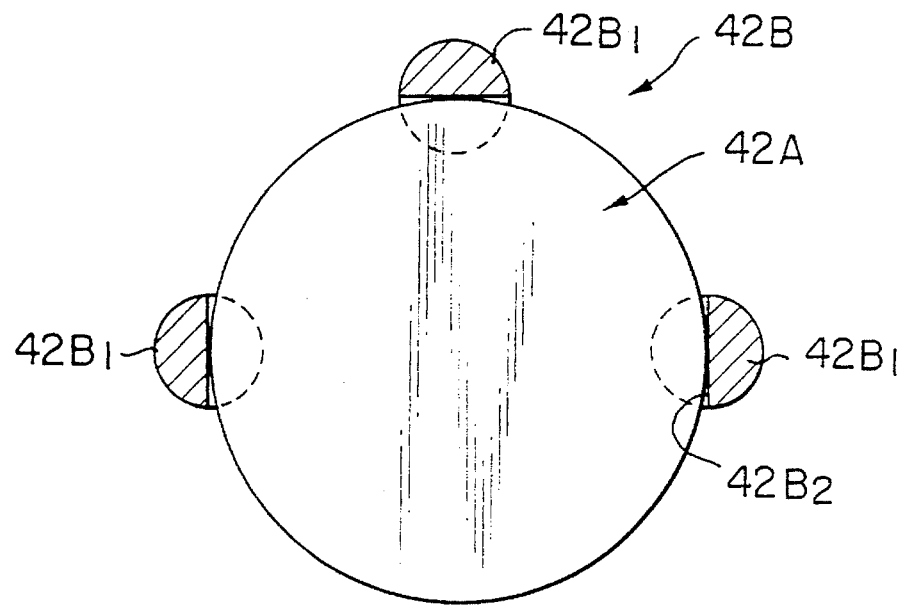
FIG. 2 is a partially broken plan view of a heat transmission preventing plate used in the heat insulator of the heat treating apparatus of FIG. 1.
Figure 3:
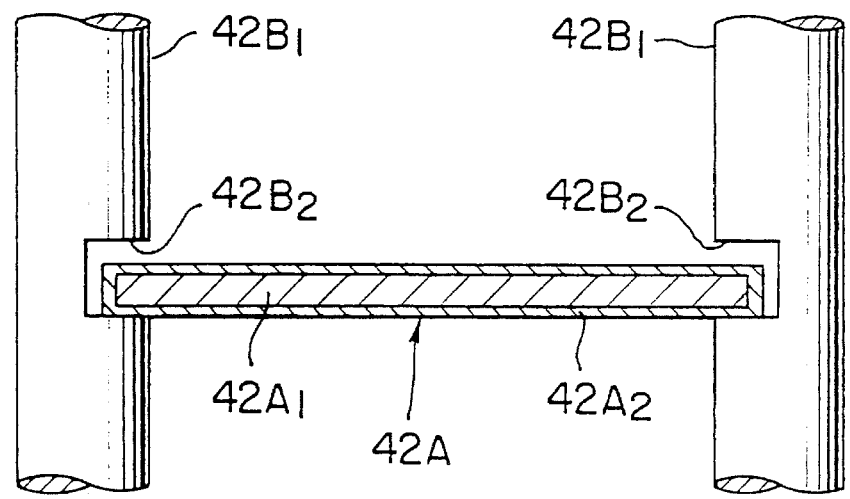
FIG. 3 is a partially enlarge view of the heat transmission preventing plate of FIG. 2.
Figure 5:
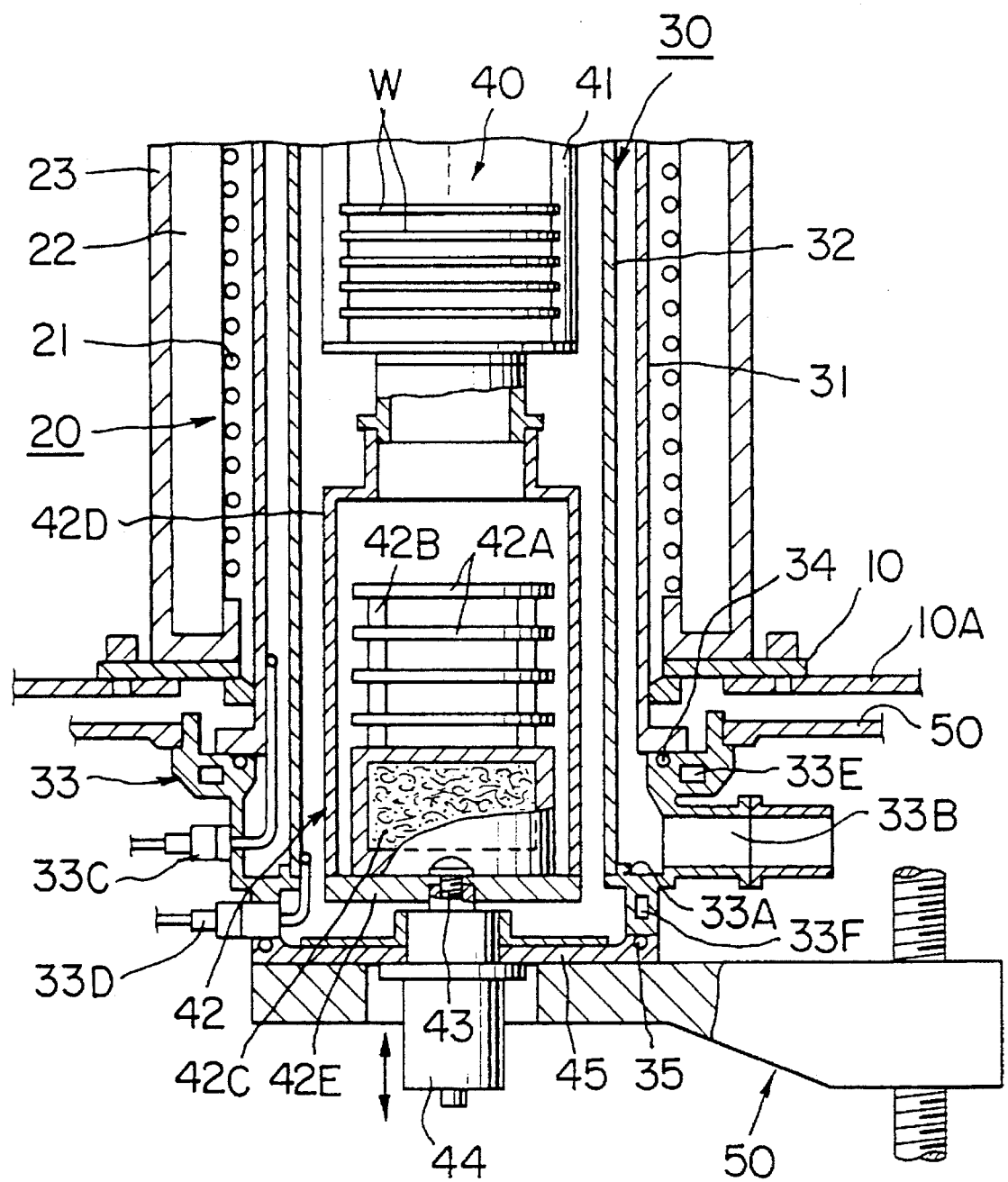
FIG. 5 is a vertical sectional view of a major part of the conventional prior art heat treating apparatus.

Each heat transmission preventing plate 42A, as enlarged in FIGS. 2 and 3, comprises an opaque quartz plate $42A_1$ which has been foamed to have inside a number of scattered open cells or closed cells, and a transparent quartz layer $42A_2$ covering the surface of the opaque quartz plate $42A_1$ the opaque quartz plate $42A_1$ preventing the transmission of heat-rays whose main component have a light of wavelengths in the infrared wavelength range.

Experiments were conducted on the heat transmission preventing plates 42A for their heat transmission preventiveness. The experiment results shows the heat transmission preventing plates 42A reflect 30–40% of heat rays in a reaction vessel 30, and absorb inside 70–60% of the heat rays, and thus the plates 42A do not substantially reflect heat rays. The heat transmission preventing plates 42A which have been heated by absorbed heat rays give forth radiation heat. So it is necessary to arrange a plurality of the heat transmission preventing plates 42A at certain intervals. The transparent quartz layer $42A_2$ prohibits rinse liquid from entering fine voids of the opaque quartz plates $42A_1$, when the plates 42A are wet-rinsed.

As shown in FIG. 3, notches $42B_2$ are formed in the respective support rods of the support body 42B for loosely receiving the peripheral edges of the heat transmission preventing plates 42A so that the heat transmission preventing plates 42A can be mounted on and dismounted from the support body 42B at the front. As shown in FIG. 2, the notches $42B_2$ of the three support rods hold the heat transmission preventing plate 42A.

As shown in FIG. 4, the support body 42B may be integrated with the heat transmission preventing plates 42A. In this case, the heat transmission preventing plates 42A are provided by opaque quartz plates having high purity with 30–120 μm diameter foams mixed in transparent quartz glasses having a density of 2.2 g/cm³ and a density of 1.9–2.1 g/cm³, i.e., a 4.5–13.6% volume percent of the foam cells based on the density, and nothing is applied to the surface of the opaque quartz plates. This is because voids constituted by a plurality of open-cell foams are substantially absent, and rinse liquid does not go into the finer voids at such a foaming ratio when the plates are wet-rinsed.

Bores are formed in the heat transmission preventing plates 42A to receive three support rods $42B_1$ of quartz or foamed quartz. Twelve sheets, for example, of plates 42A are superposed at an interval and welded to constitute the support body 42B. The surfaces of the opaque quartz plates are tempered, and annealed after assembled by welding.

Next, a case in which silicon nitride films are formed on wafers W by the heat-treatment apparatus according to this invention will be explained. First, the interior of the reaction vessel 30 is heated up to 700°–800° C. by the heating furnace 20 of FIG. 1. Then the heat-treatment boat 40 is loaded into the reaction vessel 30, and the reaction vessel 30 is sealed with the flange 45. Subsequently the reaction vessel 30 is evacuated by the exhaust pipe 33B to reduce its internal pressure. Then ammonium and dichlorosilane as source gases are introduced into the reaction vessel 30 through the source gas feed pipe 33D, and silicon nitride films are formed on the surfaces of the wafers W by the reaction of the ammonium with the dichlorosilane. At the time of forming the films, the opaque quartz plates $42A_1$ providing the heat transmission preventing plates 42A of the heat insulator 42 reflect heat rays in the reaction vessel 30 back into the reaction vessel 30, or absorb the same to prevent the transmission of the heat rays to the manifold 33. The manifold 33 is sufficiently cooled by the cooling water in the cooling water passages 33E, 33F to prevent, without failure, thermal deterioration of the O-rings 34, 35. After the film forming is over, an inert gas, such as nitrogen ($N_2$), is introduced through the gas feed pipe 33C to replace the gas in the reaction vessel 30 with the inert gas and purge the interior of the reaction vessel. Then the pressure in the reaction vessel 30 is returned to atmospheric pressure, and then the heat treatment boat 40 is unloaded from the reaction vessel 30.

As described above, according to this embodiment of the invention, the heat transmission preventing plates 42A of the heat insulator 42 effectively prevent the transmission of heat rays toward the opened lower end of the reaction vessel 30, whereby a temperature inside the reaction vessel 30 can be sufficiently retained at a temperature necessary for the heat treatment. Temperature rises of the manifold 33 can be suppressed only by the cooling water to keep the manifold sufficiently cool. As results, thermal deterioration of the O-rings 34, 35 can be prevented, and evaporation of a magnetic fluid from the magnetic seal unit 44 can be prevented so that the sealing function at these parts is not impaired for stable heat treatment. Furthermore, according to this embodiment, the heat insulator 42 does not exert excessive heat insulation from the heater so that generation of particles as a by-product of the reactive gases can be prevented, and thus yields of the heat treatment can be raised. In short, according to this embodiment, the simple structure in which the heat transmission preventing plates 42A are provided in the heat insulator 42 can sufficiently heat-insulate the interior of the reaction vessel 30, and can protect, without failure, the seal portion of the reaction vessel 30. When reacted films or others stay on the surface of the heat insulator 42 after repetition of the heat-treatments, the heat insulator 42 is cleaned with a rinse agent, such as hydrogen fluoride.

In the above-described embodiment, the heat treatment apparatus is a low-pressure CVD apparatus, but this invention is not limited to the above-described embodiment. As long as a heat treatment apparatus includes a heat insulator having heat transmission preventing plates for preventing transmission of heat rays in the reaction vessel in a heat treatment operation, other heat treatment apparatuses, such as atmospheric CVD apparatuses, oxidation apparatuses, dispersion apparatuses, etc. can be used.

As described above, this invention can provide a heat treating apparatus which can achieve heat-insulation sufficient for heat treatments, can secure the function of sealing the heat-treatment vessel, and can prevent generation of particles with a result of improved heat treatment yields.

What is claimed is:

1. An insulator for insulating an opening of a heat treatment vessel, comprising:

heat transmission preventing plates formed of high purity opaque quartz, at least one the heat transmission preventing plates having at least one layer of transparent quartz applied thereto; and support means for supporting the heat transmission preventing plates in an arrangement to prevent transmission of heat through an opening of a heat treatment vessel when the insulator is positioned at the opening during a heat treatment operation.

2. The insulator of claim 1, wherein the support means includes three support rods, each of the support rods having notches formed therein for receiving the heat transmission preventing plates.

3. The insulator of claim 2, wherein the notches are formed so that the heat transmission preventing plates are supported horizontally by the support means.

4. The insulator of claim 1, wherein the heat transmission preventing plates are integral with the support means.

5. The insulator of claim 4, wherein the heat transmission preventing plates are supported horizontally by the support means.

6. The insulator of claim 1, wherein the heat transmission preventing plates are baked.

7. The insulator of claim 1, further including a cylinder surrounding the support means and the heat transmission preventing plates.

8. An insulator for insulating an opening of a heat treatment vessel, comprising:

heat transmission preventing plates formed of a foamed high purity opaque quartz, a surface of at least one of the heat transmission preventing plates having voids which are sufficiently fine that rinse liquids do not enter the voids when the surface is wet-rinsed; and support means for supporting the heat transmission preventing plates in an arrangement to prevent transmission of heat through an opening of a heat treatment vessel when the insulator is positioned at the opening during a heat treatment operation.

9. The insulator of claim 8, wherein the foam cell diameter of the foamed high purity opaque quartz ranges from 30 μm to 120 μm.

10. The insulator of claim 8, wherein the density of the foamed high purity opaque quartz ranges from 1.9 g/cm$^3$ to 2.1 g/cm$^3$.

11. The insulator of claim 8, wherein the foam cell diameter of the foamed high purity opaque quartz ranges from 30 μm to 120 μm, and the density of the foamed high purity opaque quartz ranges from 1.9 g/cm$^3$ to 2.1 g/cm$^3$.

12. A heat treatment apparatus comprising:

a heat treatment vessel having an opening at one end, through which objects to be treated by said heat treatment apparatus are loaded into the heat treatment vessel;

an insulator for insulating the opening during heat treatment, the insulator including heat transmission preventing plates formed of high purity opaque quartz, at least one of the heat transmission preventing plates having at least one layer of transparent quartz applied thereto; and support means for supporting the heat transmission preventing plates in an arrangement to prevent transmission of heat through the opening when the insulator is positioned at the opening.

13. The heat treatment apparatus of claim 12, wherein the support means includes three support rods, each of the support rods having notches formed therein for receiving the heat transmission preventing plates.

14. The heat treatment apparatus of claim 13, wherein the notches are formed so that the heat transmission preventing plates are supported horizontally by the support means.

15. The heat treatment apparatus of claim 12, wherein the heat transmission preventing plates are integral with the support means.

16. The heat treatment apparatus of claim 15, wherein the heat transmission preventing plates are supported horizontally by the support means.

17. The heat treatment apparatus of claim 12, wherein the heat transmission preventing plates are baked.

18. The heat treatment apparatus of claim 12, wherein the insulator further includes a cylinder surrounding the support means and the heat transmission preventing plates.

19. The heat treatment apparatus of claim 12, further including heating means, for heating an inside of the heat treatment vessel to a temperature ranging from 600° C. to 900° C.

20. The heat treatment apparatus of claim 12, further including gas feeding means for feeding gas into the heat treatment vessel.

21. The heat treatment apparatus of claim 12, further including cooling means for maintaining a seal surface proximal the opening at a temperature ranging from 110° C. to 180° C.

22. A heat treatment apparatus comprising:

a heat treatment vessel having an opening at one end, through which objects to be treated by said heat treatment apparatus are loaded into the heat treatment vessel;

an insulator for insulating the opening during heat treatment, the insulator including heat transmission preventing plates formed of a foamed high purity opaque quartz, a surface of at least one of the heat transmission preventing plates having voids which are sufficiently fine that rinse liquids do not enter the voids when the surface is wet-rinsed; and support means for supporting the heat transmission preventing plates in an arrangement to prevent transmission of heat through the opening when the insulator is positioned at the opening.

23. The heat treatment apparatus of claim 22, wherein the foam cell diameter of the foamed high purity opaque quartz ranges from 30 μm to 120 μm.

24. The heat treatment apparatus of claim 22, wherein the density of the foamed high purity opaque quartz ranges from 1.9 g/cm$^3$ to 2.1 g/cm$^3$.

25. The heat treatment apparatus of claim 22, wherein the foam cell diameter of the foamed high purity opaque quartz ranges from 30 μm to 120 μm, and the density of the foamed high purity opaque quartz ranges from 1.9 g/cm$^3$ to 2.1 g/cm$^3$.

* * * * *